(12) United States Patent
Dutta et al.

(10) Patent No.: US 12,125,790 B2
(45) Date of Patent: Oct. 22, 2024

(54) AIRGAP ISOLATION FOR BACK-END-OF-THE-LINE SEMICONDUCTOR INTERCONNECT STRUCTURE WITH TOP VIA

(71) Applicant: International Business Machines Corporation, Armonk, NY (US)

(72) Inventors: Ashim Dutta, Clifton Park, NY (US); Ekmini Anuja De Silva, Slingerlands, NY (US); Praveen Joseph, White Plains, NY (US); Jennifer Church, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 445 days.

(21) Appl. No.: 17/449,381

(22) Filed: Sep. 29, 2021

(65) Prior Publication Data

US 2023/0099965 A1    Mar. 30, 2023

(51) Int. Cl.
*H01L 23/532*    (2006.01)
*H01L 21/768*    (2006.01)

(52) U.S. Cl.
CPC .... *H01L 23/53295* (2013.01); *H01L 21/7682* (2013.01); *H01L 21/76834* (2013.01); *H01L 21/76837* (2013.01)

(58) Field of Classification Search
CPC .......... H01L 23/53295; H01L 21/7682; H01L 21/76834; H01L 21/76837; H01L 23/5222; H01L 21/76885; H01L 21/76897; H01L 29/515; H01L 21/311; H01L 27/0886; H01L 29/6653; H01L 21/764; H01L 29/4991; H01L 29/6656; H01L 29/66545; H01L 29/66795; H01L 29/785; H01L 29/42364; H01L 29/66803; H01L 21/76264; H01L 21/76289; H10B 10/12

See application file for complete search history.

(56) References Cited

U.S. PATENT DOCUMENTS

| | | | |
|---|---|---|---|
| 6,492,732 B2 | 12/2002 | Lee |
| 6,861,332 B2 | 3/2005 | Park |
| 6,903,002 B1 | 6/2005 | Ben-Tzur |
| 7,094,669 B2 | 8/2006 | Bu |
| 8,203,212 B2 | 6/2012 | Anderson |
| 9,607,881 B2 | 3/2017 | Liu |
| 9,679,852 B2 | 6/2017 | Dutta |
| 10,734,277 B2 | 8/2020 | Yang |
| 10,748,812 B1 | 8/2020 | Cheng |

(Continued)

*Primary Examiner* — Mohammad A Rahman
(74) *Attorney, Agent, or Firm* — Tihon Poltavets

(57) ABSTRACT

Airgap isolation for back-end-of-the-line interconnect structures includes a dielectric liner formed above a top surface and opposite sidewalls of each of a plurality of metal lines on a substrate, the dielectric liner disposed above a top surface of the substrate not covered by the plurality of metal lines, portions of the dielectric liner located on the opposite sidewalls of each of the plurality of metal lines are separated by a space. A dielectric cap is disposed above an uppermost surface of portions of the dielectric liner above each of the plurality of metal lines and above the space, the dielectric cap pinches-off the space between portions of the dielectric liner located on the opposite sidewalls of each of the plurality of metal lines for providing airgaps between adjacent metal lines.

20 Claims, 9 Drawing Sheets

(56) References Cited

U.S. PATENT DOCUMENTS

| 10,950,493 | B1 | 3/2021 | Cheng | |
|---|---|---|---|---|
| 2010/0093168 | A1* | 4/2010 | Naik | H01L 21/76834 |
| | | | | 438/618 |
| 2014/0151888 | A1 | 6/2014 | Tsai | |
| 2017/0278796 | A1* | 9/2017 | Briggs | H01L 21/76831 |
| 2023/0069420 | A1* | 3/2023 | Zhang | H10B 43/27 |

* cited by examiner

AIRGAP ISOLATION FOR BACK-END-OF-THE-LINE SEMICONDUCTOR INTERCONNECT STRUCTURE WITH TOP VIA

BACKGROUND

The present invention generally relates to the field of semiconductor devices, and more particularly to embedding air gaps within back-end-of-the-line (BEOL) interconnect structures of a semiconductor device.

With the current trends in integrated circuit (IC) miniaturization, and increasingly smaller critical dimensions, it is desirable in semiconductor device technology to integrate many different functions on a single chip. In the IC chip fabrication industry, there are three sections referred to in a typical IC chip build: front end of the line (FEOL), back end of the line (BEOL) and the section that connects those two together, the middle of the line (MOL). The FEOL is made up of the semiconductor devices, e.g., transistors, the BEOL is made up of interconnects and wiring, and the MOL is an interconnect between the FEOL and BEOL that includes material to prevent the diffusion of BEOL metals to FEOL devices.

BEOL generally begins when the first layer of metal is deposited on the wafer. BEOL includes contacts, insulating layers (dielectrics), metal levels, and bonding sites for chip-to-package connections. The formation of high quality interconnects is a critical part of ultra large-scale integration (VLSI) integrated circuits. In conventional fabrication processes, vias and upper wiring structures are formed, for example, in a dual damascene process. In this type of process, via openings and trenches are formed in a dielectric layer prior to the deposition of metal materials.

Forming BEOL interconnect structures generally includes a top via integration scheme. The top via integration scheme integrally forms a via on top of a trench. Thus, the via is fully aligned and can be of a desired critical dimension. This technology may allow for interconnect scaling with reduced resistive-capacitance (RC). However, one of the main challenges in the RC reduction approach is finding low-k dielectric materials that are sufficiently robust to provide a time dependent dielectric breakdown (TDDB) benefit.

SUMMARY

According to an embodiment of the present disclosure, a semiconductor structure includes a plurality of metal lines above a substrate, a dielectric liner above a top surface and opposite sidewalls of each of the plurality of metal lines and above a top surface of the substrate, portions of the dielectric liner located on the opposite sidewalls of each of the plurality of metal lines are separated by a space, and a dielectric cap above an uppermost surface of portions of the dielectric liner above each of the plurality of metal lines and above the space, the dielectric cap pinches-off the space between portions of the dielectric liner located on the opposite sidewalls of each of the plurality of metal lines for providing airgaps between the plurality of metal lines.

According to another embodiment of the present disclosure, a method of forming a semiconductor structure includes forming a plurality of metal lines above a substrate, conformally depositing a dielectric liner above a top surface and opposite sidewalls of each of the plurality of metal lines and above a top surface of the substrate, portions of the dielectric liner located on the opposite sidewalls of each of the plurality of metal lines being separated by a first space, depositing a first masking layer above the dielectric liner, recessing the first masking layer to expose top portions of the metal liner, remaining portions of the first masking layer substantially fill the first space, a second space remains above recessed portions of the first masking layer between exposed top portions of the metal liner, forming a dielectric cap above the exposed top portions of the metal liner and above the remaining portions of the first masking layer to pinch-off the second space, and removing the first masking layer to form airgaps between adjacent metal lines covered by the dielectric liner.

According to yet another embodiment of the present disclosure, a method of forming a semiconductor structure includes forming a plurality of metal lines above a substrate, conformally depositing a dielectric liner above a top surface and opposite sidewalls of each of the plurality of metal lines and above a top surface of the substrate, portions of the dielectric liner located on the opposite sidewalls of each of the plurality of metal lines being separated by a first space, depositing a first masking layer above the dielectric liner, recessing the first masking layer to expose top portions of the metal liner, remaining portions of the first masking layer substantially filling the first space, wherein a second space remains above recessed portions of the first masking layer between exposed top portions of the metal liner, forming a dielectric cap within the second space, above the exposed top portions of the metal liner and above remaining portions of the first masking layer, and forming a second masking layer above the dielectric cap.

BRIEF DESCRIPTION OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
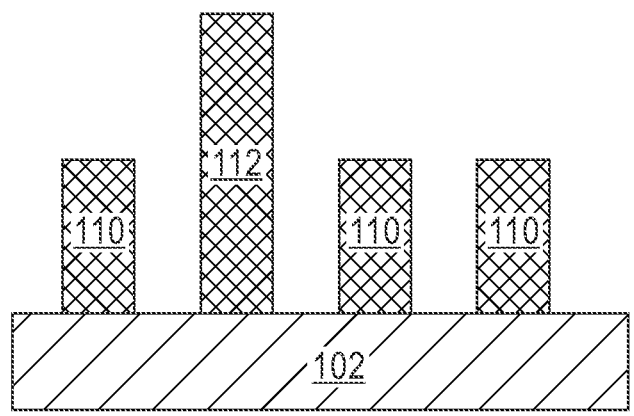
FIG. 1 is a cross-sectional view of a semiconductor structure at an intermediate step during a semiconductor manufacturing process, according to an embodiment of the present disclosure.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

As previously mentioned, the formation of BEOL interconnect structures generally includes a top via integration scheme. This technology may allow for interconnect scaling with reduced resistive-capacitance (RC). However, one of the main challenges in the RC reduction approach is finding low-k dielectric materials that are sufficiently robust to provide a time dependent dielectric breakdown (TDDB) benefit.

Since air is the ultimate low-k material having a relative permittivity value of approximately 1.0, airgap spacers are being pursued as a viable alternative for reducing parasitic capacitance and resistance in integrated circuits (IC). However, the placement of airgaps between the conducting wires can compromise the mechanical stability of the integrated circuit. Nevertheless, strategic placement of airgaps can improve the chip's electrical performance by satisfying low RC delay requirements during BEOL processes without compromising its durability.

Therefore, embodiments of the present disclosure provide a semiconductor structure and a method of making the same in which airgaps are embedded in BEOL interconnect structures with top via for RC reduction and improved electrical performance. Additionally, embodiments of the present disclosure provide airgap spacers having a controllable size that can be tuned according to design requirements facilitating IC scaling with improved RC performance.

An embodiment by which the airgaps can be formed is described in detailed below by referring to the accompanying drawings in FIGS. 1-8. Another embodiment by which the airgaps can be formed is described in detailed below by referring to the accompanying drawings in FIGS. 9-18.

Referring now to FIG. 1, a cross-sectional view of a semiconductor structure 100 at an intermediate step during a back-end-of-the-line (BEOL) integration process is shown, according to an embodiment of the present disclosure. In this embodiment, the semiconductor structure 100 includes a simplistically depicted integrated circuit (IC) consisting of a substrate 102, metal lines 110 and a metal line with top via 112. Known semiconductor fabrication operations have been used to form the semiconductor structure 100 as depicted in FIG.1. In this embodiment, the substrate 102 is not intended to be limited and can represent front end of line (FEOL) components. FEOL generally refers to the construction of the components of the IC directly inside the wafer. In some embodiments, the substrate 102 may include an inter-layer dielectric and various circuit components, ground terminals, and/or power terminals. Further, the substrate 102 is illustrated as a single layer to simplify the drawings and explanation, since all such additional components are not relevant to this invention.

As mentioned above, methods well-known in the art can be used to formed the metal lines 110 and metal line with top via 112. Particularly, in this embodiment, the metal lines 110 and metal line with top via 112 are formed using a top via integration scheme. Also, it should be noted that, in this embodiment, the minimum center-to-center distance between interconnect lines corresponds to a tight pitch configuration. However, other configurations may also be considered.

Conventional techniques related to semiconductor device and IC fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Figure 2:
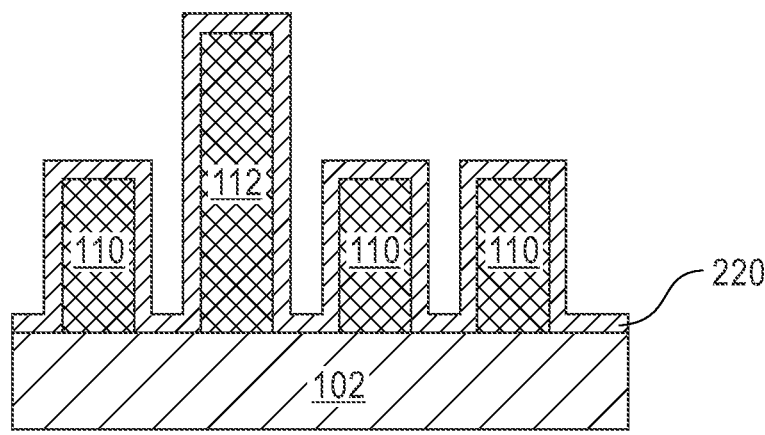
FIG. 2 is a cross-sectional view of the semiconductor structure after forming a first dielectric liner, according to an embodiment of the present disclosure.

Referring now to FIG. 2, a cross-sectional view of the semiconductor structure 100 is shown after depositing a first dielectric liner 220, according to an embodiment of the present disclosure. The first dielectric liner 220 may be conformally deposited above uppermost surfaces of the substrate 102, metal lines 110 and metal line with top via 112, as depicted in the figure. In an exemplary embodiment, an atomic layer deposition (ALD) process can be used to form the first dielectric liner 220 on the semiconductor structure 100. The dielectric material forming the first dielectric liner 220 can be a high-k or moderate-k dielectric material such as, for example, HfOx, TiOx, ZnOx, SiOx, SiN, SiC, and combinations thereof. A thickness of the first dielectric liner 220 may vary between approximately 2 nm and approximately 20 nm, and ranges therebetween.

Figure 3:
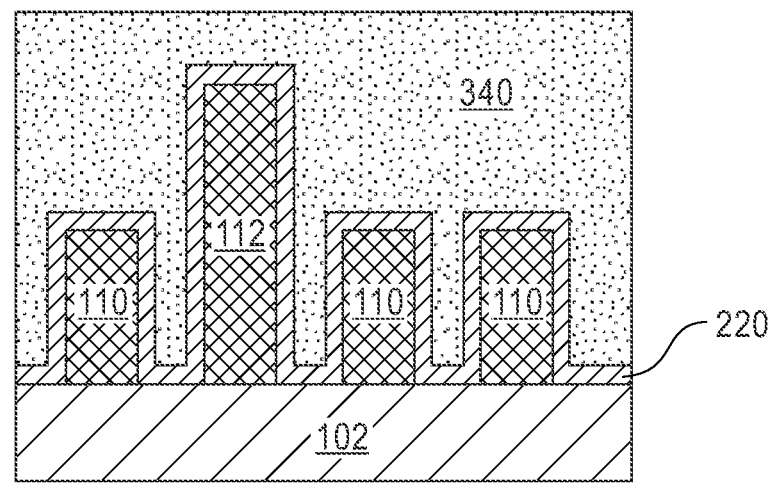
FIG. 3 is a cross-sectional view of the semiconductor structure after forming a first masking layer above the first dielectric liner, according to an embodiment of the present disclosure.

Referring now to FIG. 3, a cross-sectional view of the semiconductor structure 100 is shown after forming a first masking layer 340 above an uppermost surface of the first dielectric liner 220, according to an embodiment of the present disclosure.

In an embodiment, the first masking layer 340 acts as a template material for subsequent air gap formation. The first masking layer 340 can be an organic planarization layer (OPL) that is formed on the semiconductor structure 100 to fill a space between adjacent metal lines 110 and a space between metal lines 110 and metal line with top via 112. The first masking layer 340 can be made of any organic planarizing material that is capable of effectively preventing damage of underlying layers or structures during subsequent etching processes. The first masking layer 340 can include, but is not necessarily limited to, an organic polymer including C, H, and N. According to an embodiment, the OPL material can be free of silicon (Si). According to another embodiment, the OPL material can be free of Si and fluorine (F). As defined herein, a material is free of an atomic element when the level of the atomic element in the material is at or below a trace level detectable with analytic methods available in the art. Non-limiting examples of the OPL material forming the first masking layer 340 can include JSR HM8006, JSR HM8014, AZ UM10M2, Shin Etsu ODL 102, or other similar commercially available materials. The masking layer 340 may be deposited by, for example, spin coating.

Figure 4:
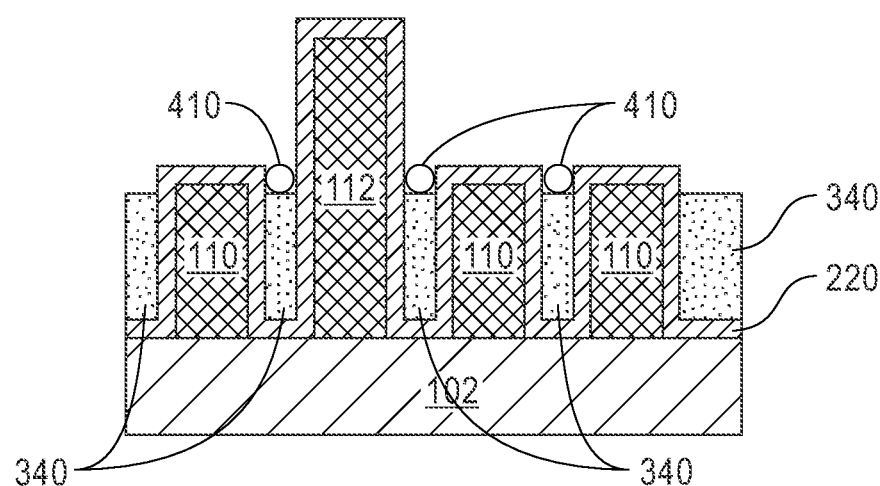
FIG. 4 is a cross-sectional view of the semiconductor structure after etching back the first masking layer, according to an embodiment of the present disclosure.

Referring now to FIG. 4, a cross-sectional view of the semiconductor structure 100 is shown after etching back the first masking layer 340, according to an embodiment of the present disclosure. In an exemplary embodiment, etching the first masking layer 340 can be conducted by, for example, an OPL reactive ion etching (RIE) using an oxygen or N2/H2 based chemistry including a trace point detection.

Recessing the first masking layer 340 exposes top portions of the first dielectric liner 220 located above the metal lines 110 and above the metal line with top via 112. As depicted in the figure, upper lateral portions (i.e., portions perpendicular to the substrate 102) of the first dielectric liner 220 located on opposite sidewalls of the metal line with top via 112 are also exposed after etching the first masking layer 340. First spaces or openings 410 are formed above an uppermost surface of the recessed first masking layer 340, between adjacent exposed upper portions of the first dielectric liner 220.

According to an embodiment, the OPL material forming the first masking layer 340 is subjected to an interface modification process by surface functionalization with self-assembled monolayers (SAMs). As may be known by those skilled in the art, SAMs are used in a variety of applications for interface tuning of, for example, dielectric layers, oxides, metals and organic materials to enhance performance in transistors or improved processability and solubility. Specifically, the OPL material forming the first masking layer 340 can be tuned with SAM to increase hydrophobicity and prevent metal-oxides (MeOx) deposition. It should be noted that similar methodologies are currently used to enable silicon nitride (SiN) deposition on dielectrics and not on the modified OPL material.

As can be observed in the figure, the first masking layer 340 remains in areas of the semiconductor structure 100 located between adjacent metal lines 110 and areas between metal lines 110 and metal line with top via 112. Stated differently, the first masking layer 340 fills areas of the semiconductor structure 100 below the first spaces 410.

Figure 5:
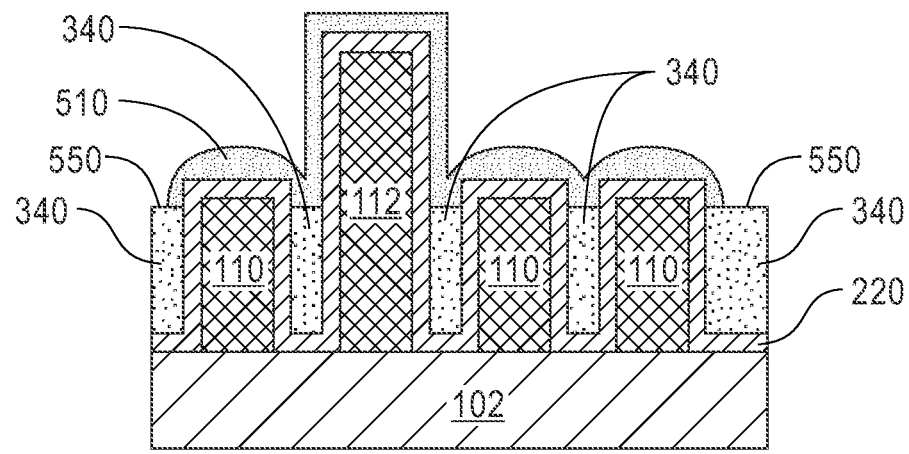
FIG. 5 is a cross-sectional view of the semiconductor structure after depositing a first dielectric cap, according to an embodiment of the present disclosure.

Referring now to FIG. 5, a cross-sectional view of the semiconductor structure 100 is shown after depositing a first dielectric cap 510, according to an embodiment of the present disclosure. In this embodiment, standard deposition techniques (e.g., ALD, CVD, PECVD, etc.) can be used to selectively form the first dielectric cap 510 above top portions of the first masking layer 340 and exposed upper portions of the first dielectric liner 220.

In this embodiment, the first dielectric cap 510 is made of a (capping) dielectric material that deposits preferentially on the first dielectric liner 220 and pinches-off the first spaces 410 (FIG. 4) located above an uppermost surface of the first masking layer 340 between adjacent exposed upper portions of the first dielectric liner 220. As depicted in the figure, the first dielectric cap 510 partially covers the underlying first masking layer 340. Although not depicted in the figure, it should be noted that the first dielectric cap 510 does not deposit on large open regions (not shown) of the first masking layer 340 (i.e., regions without metal lines), thereby keeping portions of the first masking layer 340 exposed. It should be noted that the SAM coating on OPL (i.e., first masking layer 340) inhibits the deposition of the first dielectric cap 510 above outer or open area 550 of the first masking layer 340, as depicted in the figure.

The first dielectric cap 510 may include an insulator of hafnium oxide (HfOx), titanium oxide (TiOx), silicon nitride (SiN), silicon carbide (SiC) or the like which may function as both a barrier, particularly when a low-k material that may be subject to diffusion of moisture is used as interlevel dielectric, and an etch stop used when fabricating subsequent metallization level(s). The first dielectric cap 510 may be formed by any deposition method known in the art, and may typically have a thickness varying from approximately 5 nm to approximately 20 nm. Preferably, the first dielectric cap 510 is formed using an atomic layer deposition process (ALD).

Figure 6:
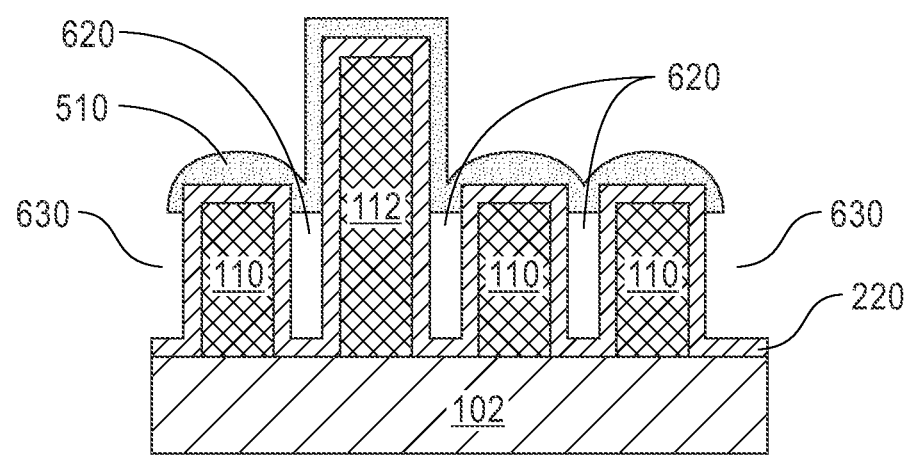
FIG. 6 is a cross-sectional view of the semiconductor structure after removing the first masking layer, according to an embodiment of the present disclosure.

Referring now to FIG. 6, a cross-sectional view of the semiconductor structure 100 is shown after removing the first masking layer 340, according to an embodiment of the present disclosure. Exemplary techniques suitable for removing the first masking layer 340 (FIG. 5) from the semiconductor structure 100 may include, but are not limited to, oxygen plasma, nitrogen plasma, hydrogen plasma or other carbon strip or ashing process, which causes minimal or no damage to the underlying layers or structures. In a preferred embodiment, a conventional oxygen ($O_2$) or N2/H2 ashing process is used to remove all of the organic material forming the first masking layer 340 from the open regions (not shown) as well as from the first spaces 410 (FIG. 4). In this embodiment, the removal chemistry used to remove the first masking layer 340 does not damage the metal line with top via 112 and/or the metal lines 110 due to the presence of the first dielectric liner 220.

As depicted in the figure, removal of the first masking layer 340 creates first airgaps 620 in the semiconductor structure 100. By pinching-off the first spaces 410 (FIG. 4) with a dielectric material (i.e., first dielectric cap 510) and selectively removing the first masking layer 340, first airgaps 620 are formed in the semiconductor structure 100. Specifically, in this embodiment, air is trapped within gaps (not shown) remaining between metal lines 110 and between metal lines 110 and metal line with top via 112 after removing the first masking layer 340. Each region of trapped air defines a first airgap 620 within the semiconductor structure 100. Since air has a dielectric constant of approximately 1, the first airgaps 620 may help reduce parasitic capacitance and improve thermal isolation between metal lines 110 and between metal lines 110 and metal line with top via 112. Additionally, the use of a sacrificial organic material (i.e., first masking layer 340) allows a size of the first airgaps 620 to be controllable for IC scaling with improved RC performance.

As can be observed in the figure, removal of the first masking layer 340 (FIG. 5) exposes lateral portions 630 of the first dielectric liner 220 located below outer areas 550 of the first masking layer 340 shown in FIG. 5.

It should be noted that a size of the first airgaps 620 formed using embodiments of the present disclosure is defined by the thickness of the first dielectric liner 220, a pitch between metal lines 110 and between metal lines 110 and metal line with top via 112, and a height of the metal lines 110. Thus, the size of the first airgaps 620 can be adjusted or controlled according to design requirements.

Figure 7:
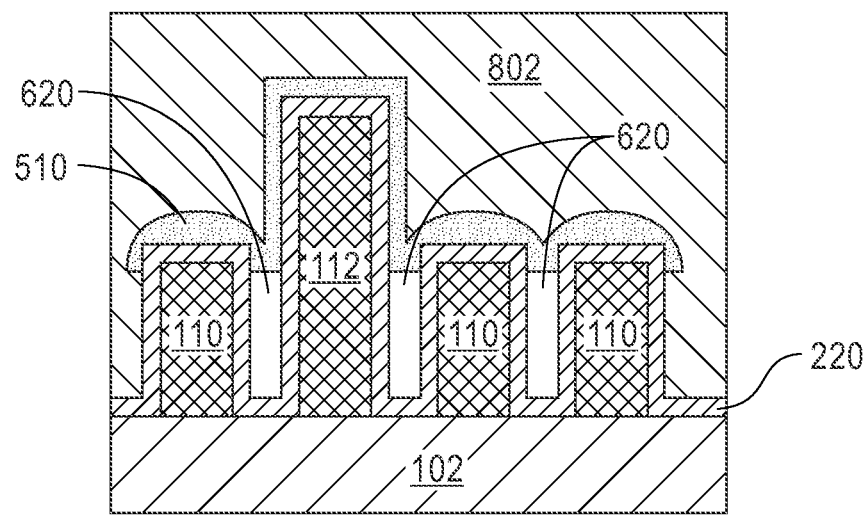
FIG. 7 is a cross-sectional view of the semiconductor structure after forming a first dielectric layer, according to an embodiment of the present disclosure.
Figure 8:
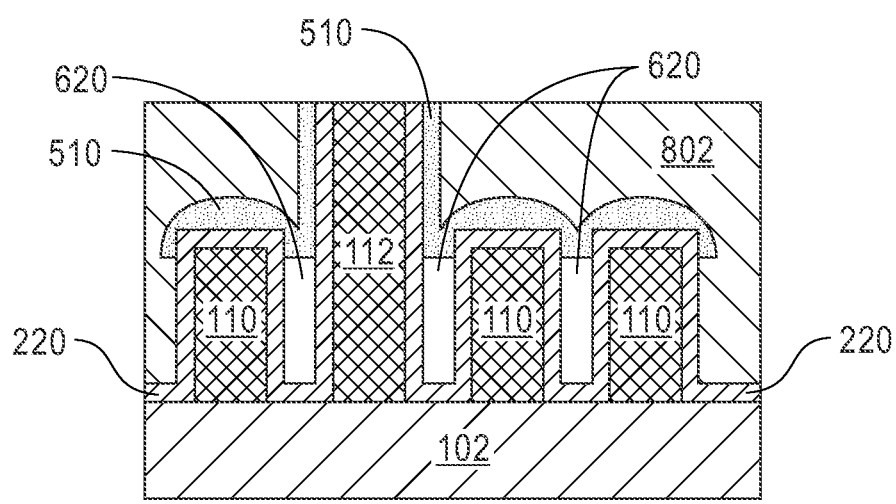
FIG. 8 is a cross-sectional view of the semiconductor structure after conducting a chemical mechanical polishing, according to an embodiment of the present disclosure.

Referring now to FIG. 7 and FIG. 8 simultaneously, cross-sectional views of the semiconductor structure 100 are shown after forming a first dielectric layer 802 followed by a CMP process, according to an embodiment of the present disclosure.

The first dielectric layer 802 is formed above the first dielectric cap 510 and exposed lateral portions 630 (FIG. 6) of the first dielectric liner 220, as shown in FIG. 7. The first dielectric layer 802 includes a low-k dielectric material. Exemplary low-k dielectric materials include, but are not limited to, silicon oxide, organosilicates, silsequioxanes, undoped silicate glass (USG), fluorosilicate glass (FSG), borophosphosilicate glass (BPSG), and hydrogenated carbon doped silicon oxide (SiCOH). The first dielectric layer 802 may be formed by CVD, plasma enhanced chemical vapor deposition (PECVD) or spin coating. A thickness of the first dielectric layer 802 can vary from approximately 50 nm to approximately 1,000 nm, although lesser and greater thicknesses can also be employed.

After deposition of the first dielectric layer 802, a CMP process or etch back planerization process is generally conducted on the semiconductor structure 100. After this step, an uppermost surface of the metal line with top via 112 is exposed, as shown in FIG. 8.

FIGS. 9-18 below represent an alternate sequence for forming air gaps in BEOL interconnect structures with top via according to additional embodiments of the present disclosure.

Figure 9:
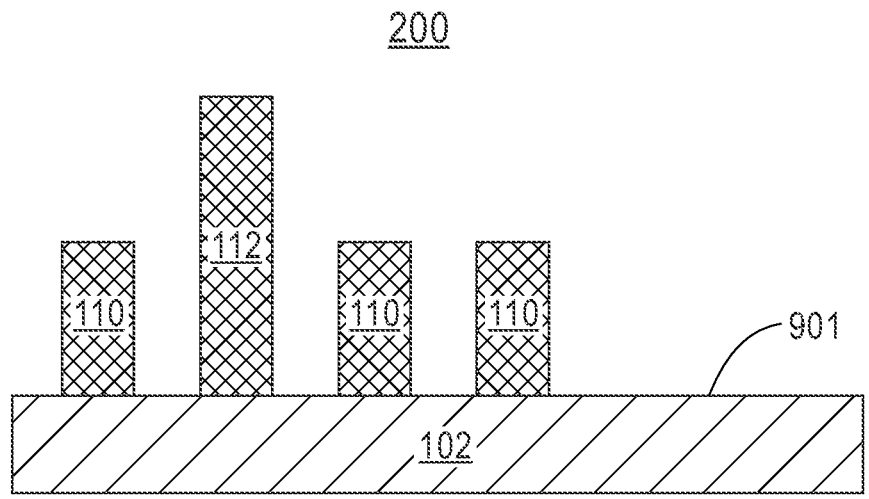
FIG. 9 is a cross-sectional view of a semiconductor structure at an intermediate step during a semiconductor manufacturing process, according to another embodiment of the present disclosure.

Referring now to FIG. 9, a cross-sectional view of a semiconductor structure 200 at an intermediate step during a BEOL integration process is shown, according to another embodiment of the present disclosure. Similar to the semiconductor structure 100 (FIGS. 1-8), at this point of the manufacturing process, the semiconductor structure 200 includes the metal lines 110, the metal line with top via 112 and the substrate 102. As mentioned above, methods well-known in the art have been used to form the metal lines 110 and metal line with top via 112. Particularly, in this embodiment, the metal lines 110 and metal line with top via 112 are formed using a top via integration scheme. Also, it should be noted that, in this embodiment, the minimum center-to-center distance between interconnect lines corresponds to a large pitch configuration, although tight pitch configurations may also be considered.

Figure 10:
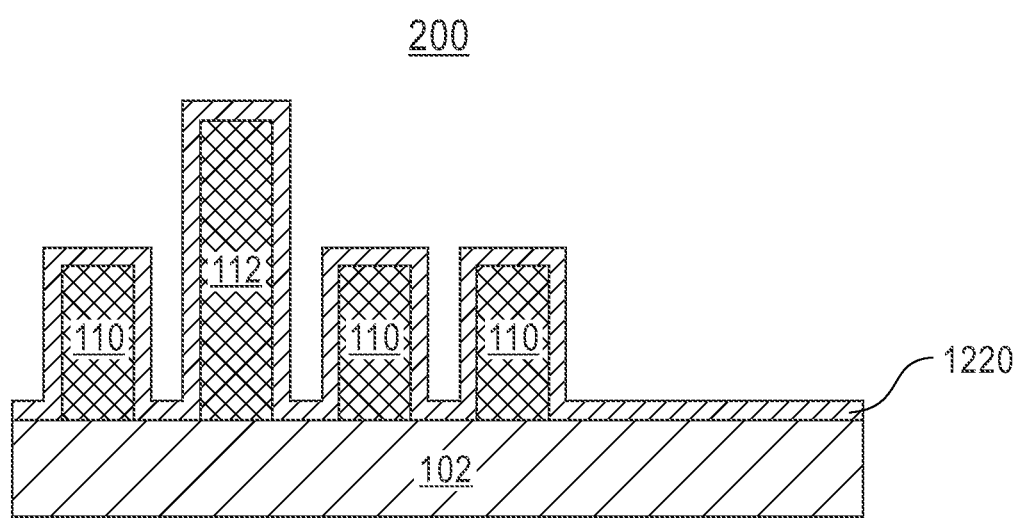
FIG. 10 is a cross-sectional view of the semiconductor structure after forming a second dielectric liner, according to another embodiment of the present disclosure.

Referring now to FIG. 10, a cross-sectional view of the semiconductor structure 200 is shown after forming a second dielectric liner 1220, according to an embodiment of the present disclosure. It should be noted that the second dielectric liner 1220 is made of analogous materials and is formed in similar ways as the first dielectric liner 220 described above with reference to FIG. 2.

Figure 11:
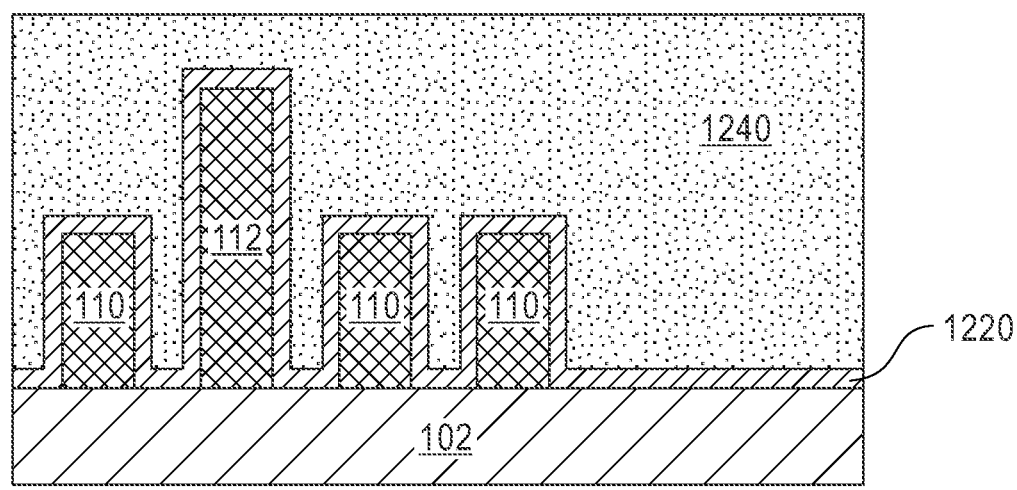
FIG. 11 is a cross-sectional view of the semiconductor structure after depositing a second masking layer, according to another embodiment of the present disclosure.
Figure 12:
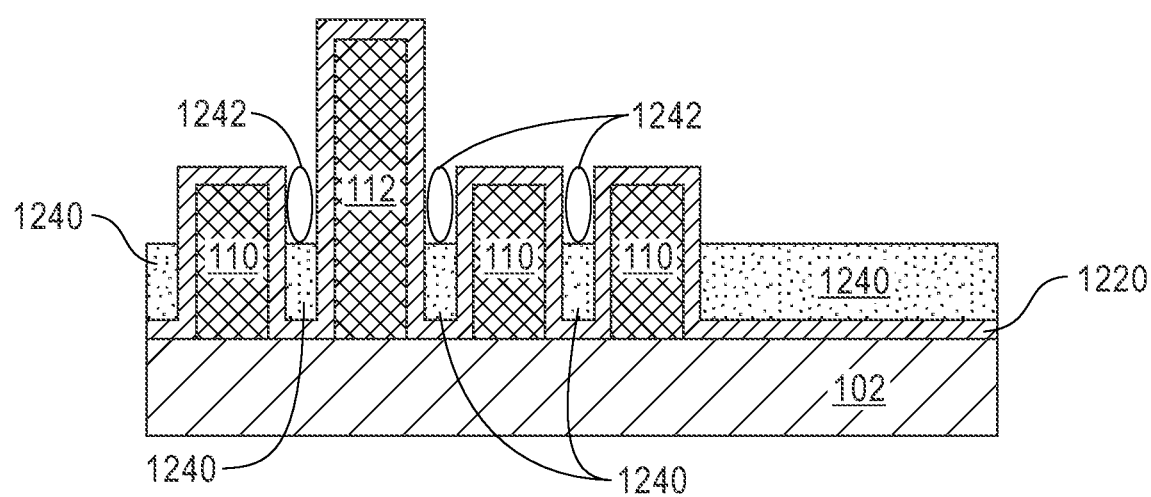
FIG. 12 is a cross-sectional view of the semiconductor structure after recessing the second masking layer, according to another embodiment of the present disclosure.

Referring now to FIG. 11 and FIG. 12 simultaneously, cross-sectional views of the semiconductor structure 200 are shown after depositing and recessing a second masking layer 1240, according to an embodiment of the present disclosure. Similar to the first masking layer 340 (FIG. 3), the second masking layer 1240 is formed above an uppermost surface of the second dielectric liner 1220 and includes an organic planarizing material that acts as a template material for subsequent air gap formation. The second masking layer 1240 substantially fills a space between adjacent metal lines 110 and a space between metal lines 110 and metal line with top via 112, as depicted in the figure. In this embodiment, the second masking layer 1240 includes similar materials and is formed in similar ways as the first masking layer 340 (FIG. 3).

After depositing the second masking layer 1240, an etch back process is conducted to recess the second masking layer 1240, as depicted in FIG. 12. Recessing the second masking layer 1240 exposes top portions of the second dielectric liner 1220 located above the metal lines 110 and above the metal line with top via 112. As depicted in the figure, upper lateral portions (i.e., portions perpendicular to the substrate 102) of the second dielectric liner 1220 located on opposite sidewalls of the metal line with top via 112 are also exposed after etching the second masking layer 1240. Second spaces or openings 1242 are formed above an uppermost surface of the second masking layer 1240, between adjacent exposed upper portions of the second dielectric liner 1220, as illustrated in the figure.

In an exemplary embodiment, etching the second masking layer 1240 can be conducted by, for example, an OPL RIE including a trace point detection. As can be observed in the figure, the second masking layer 1204 remains in areas of the semiconductor structure 200 located between adjacent metal lines 110 and areas between metal lines 110 and metal line with top via 112. Stated differently, the second masking layer 1240 fills areas of the semiconductor structure 100 below the second spaces 1242 and substantially covers an area 901 (FIG. 9) of the substrate 102 extending horizontally from a metal line 110. It should be noted that, in this embodiment, the second masking layer 1204 does not need SAM or selective deposition.

Figure 13:
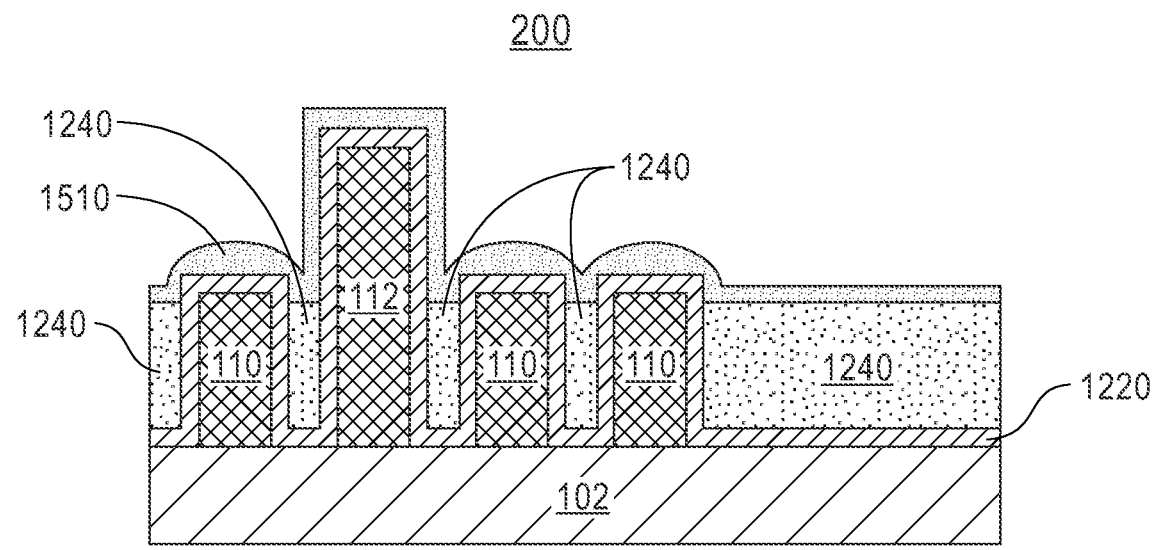
FIG. 13 is a cross-sectional view of the semiconductor structure after depositing a second dielectric cap, according to another embodiment of the present disclosure.

Referring now to FIG. 13, a cross-sectional view of the semiconductor structure 200 is shown after depositing a second dielectric cap 1510, according to an embodiment of the present disclosure. In this embodiment, conformal deposition techniques such as ALD, CVD, PECVD, can be used to (non-selectively) form the second dielectric cap 1510 above top portions of the second masking layer 1240 and exposed upper portions of the second dielectric liner 1220.

Similar to the first dielectric cap 510, the second dielectric cap 1510 is made of a (capping) dielectric material that is conformally deposited above the second dielectric liner 1220 and within the second spaces 1242 (FIG. 12) located above an uppermost surface of the second masking layer 1240 between adjacent exposed upper portions of the second dielectric liner 1220. The second dielectric cap 1510 partially covers the underlying second masking layer 1240. Although not depicted in the figure, it should be noted that the second dielectric cap 1510 deposits on tight pitch structures as well as large open regions (not shown) of the second masking layer 1240 (i.e., regions without metal lines).

The second dielectric cap 1510 may include an insulator of hafnium oxide (HfOx), titanium oxide (TiOx), silicon nitride (SiN), silicon carbide (SiC) or the like which may function as both a barrier, particularly when a low-k material that may be subject to diffusion of moisture is used as interlevel dielectric, and an etch stop used when fabricating subsequent metallization level(s). The second dielectric cap 1510 may be formed by any deposition method known in the art, and may typically have a thickness varying from approximately 5 nm to approximately 50 nm. Preferably, the second dielectric cap 1510 is formed using a ALD process.

Figure 14:
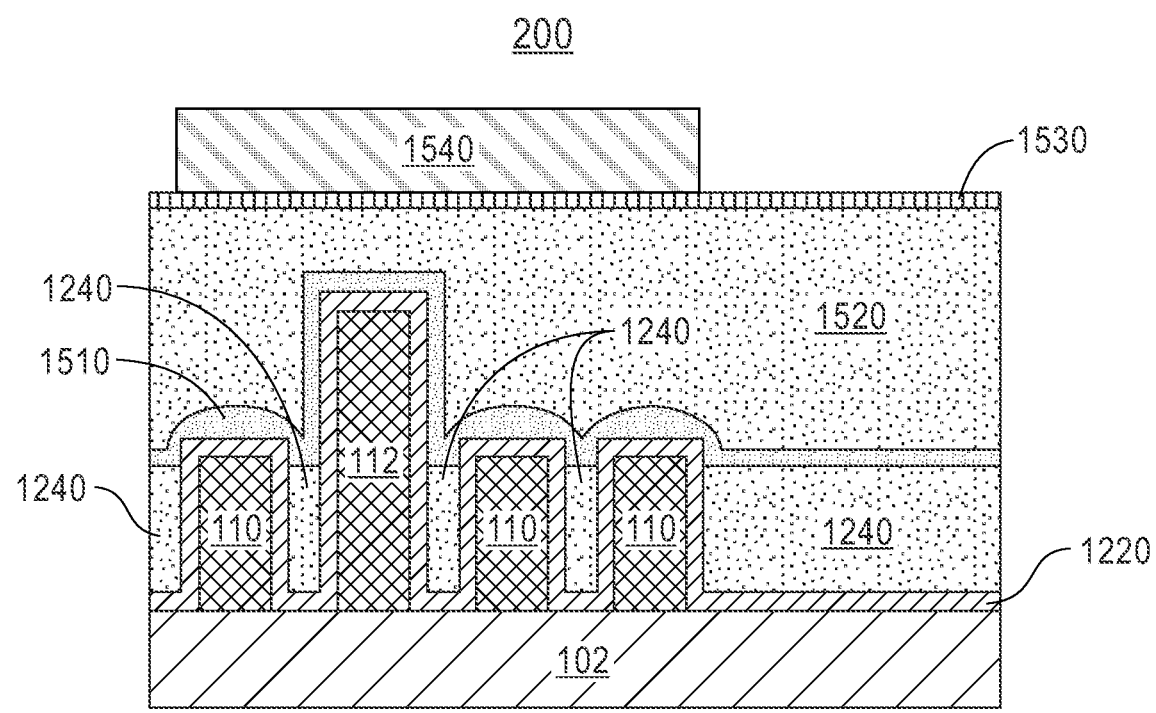
FIG. 14 is a cross-sectional view of the semiconductor structure after forming a third masking layer, a first silicon-containing antireflective layer, and a first photoresist layer, according to another embodiment of the present disclosure.

Referring now to FIG. 14, a cross-sectional view of the semiconductor structure 200 is shown after forming a third masking layer 1520, a first silicon-containing antireflective (SiARC) layer 1530 above the third masking layer 1520, and a first photoresist layer 1540 containing a first pattern (not shown) above the first SiARC layer 1530, according to an embodiment of the present disclosure.

In this embodiment, the third masking layer 1520 includes an organic planarizing material that acts as a template material similar to the organic planarizing material forming the second masking layer 1240.

The first SiARC layer 1530 may include a silicon-containing polymer. In one embodiment, the first SiARC layer 1530 includes silicon at an atomic concentration varying from approximately 1% to approximately 50%. The first SiARC layer 1530 may be applied, for example, by spin coating. A thickness of the first SiARC layer 1530 can vary from approximately 10 nm to approximately 150 nm, although lesser and greater thicknesses can also be employed.

According to an embodiment, the first photoresist layer 1540 containing the first pattern (hereinafter referred to as a patterned first photoresist layer 1540) is formed on a top surface of the first SiARC layer 1530. The patterned first photoresist layer 1540 may be formed, for example, by spin coating. A thickness of the patterned first photoresist layer 1540 can vary from approximately 50 nm to approximately 600 nm, and ranges therebetween. The patterned first photoresist layer 1540 can be a layer of a photoresist sensitive to deep-ultraviolet (DUV) radiation, extreme ultraviolet (EUV), or mid-ultraviolet (MUV) radiation as known in the art, or can be an e-beam resist that is sensitive to radiation of energetic electrons. The first patterned photoresist layer 1540 is lithographically patterned to form the first pattern therein.

Figure 15:
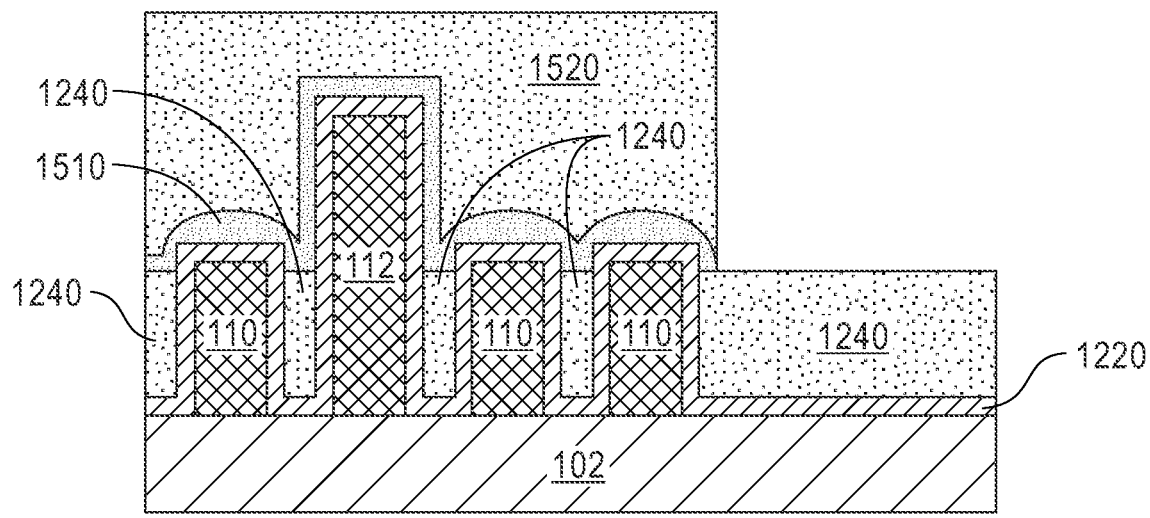
FIG. 15 is a cross-sectional view of the semiconductor structure after patterning the third masking layer, according to another embodiment of the present disclosure.

Referring now to FIG. 15, a cross-sectional view of the semiconductor structure 200 is shown after the first pattern in the patterned first photoresist layer 1540 (FIG. 14) is transferred through the first SiARC layer 1530 (FIG. 14) and the third masking layer 1520 by a pattern transfer etch, according to an embodiment of the present disclosure.

In an embodiment, the pattern transfer etch can be an anisotropic etch. For example, the pattern transfer etch can be a reactive ion etch (RIE) that removes the materials of the first SiARC layer 1530 (FIG. 14) and the third masking layer 1520 selective to the material of the second dielectric cap 1510. The remaining portions of the first SiARC layer 1530 (FIG. 14) constitute the patterned first SiARC layer 1530, while the remaining portions of the third masking layer 1520 constitute the patterned third masking layer 1520. After transferring the first pattern into the first SiARC layer 1530 and the third masking layer 1520, the patterned first photoresist layer 1540 may be removed by a conventional photoresist striping method such as, for example, plasma ashing.

After transferring the first pattern, a portion of the second masking layer 1240 above the area 901 (FIG. 9) of the substrate 102 is exposed. Stated differently, the third masking layer 1520 is removed from an uppermost surface of the second masking layer 1240 located above the area 901 (FIG. 9).

Figure 16:
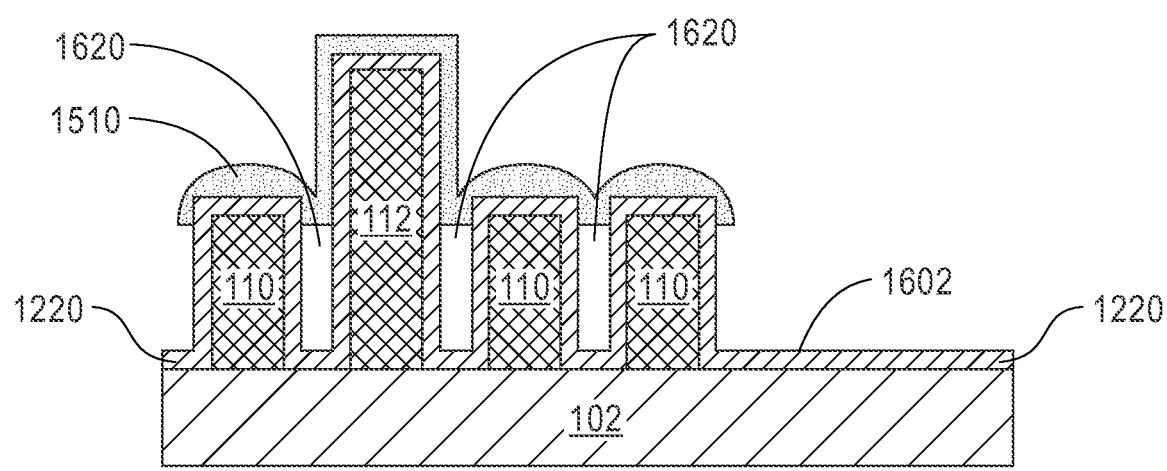
FIG. 16 is a cross-sectional view of the semiconductor structure after removing the second masking layer and the third masking layer, according to another embodiment of the present disclosure.

Referring now to FIG. 16, a cross-sectional view of the semiconductor structure 200 is shown after removing the third masking layer 1520 (FIG. 15) and the second masking layer 1240 (FIG. 15), according to an embodiment of the present disclosure. Exemplary techniques suitable for removing the third masking layer 1520 (FIG. 15) and the second masking layer 1240 (FIG. 15) from the semiconductor structure 200 may include, but are not limited to, oxygen plasma, nitrogen plasma, hydrogen plasma or other carbon strip or ashing process, which causes minimal or no damage to the underlying layers. In a preferred embodiment, a conventional oxygen ashing process is used to remove all of the organic material forming the third masking layer 1520 (FIG. 15) and the second masking layer 1240 (FIG. 15) from the semiconductor structure 200. In this embodiment, the removal chemistry used to remove the third masking layer 1520 (FIG. 15) and the second masking layer 1240 (FIG. 15) does not damage the metal line with top via 112 and/or the metal lines 110 due to the presence of the second dielectric liner 1220.

As depicted in the figure, removal of the second masking layer 1240 (FIG. 15) creates second airgaps 1620 in the semiconductor structure 200. By depositing a dielectric material (i.e., second dielectric cap 1510) on the second spaces 1242 (FIG. 12) and selectively removing the second masking layer 1240 (FIG. 15), the second airgaps 1620 can be formed in the semiconductor structure 200. Specifically, air is trapped within gaps (not shown) remaining between metal lines 110 and between metal lines 110 and metal line with top via 112 after removing the second masking layer 1240 (FIG. 15). Each region of trapped air defines a second airgap 1620 within the semiconductor structure 200. Since air has a dielectric constant of approximately 1, the second airgaps 1620 may help reduce parasitic capacitance and improve thermal isolation between metal lines 110 and between metal lines 110 and metal line with top via 112. Additionally, the use of a sacrificial organic material (i.e., second masking layer 1240) allows a size of the second airgaps 1620 to be controlled for IC scaling with improved RC performance.

As can be observed in the figure, removal of the second masking layer 1240 exposes lateral portions 1602 of the second dielectric liner 1220 located above the substrate 102 including the portion of the second dielectric liner 1220 above the area 901 (FIG. 9) of the substrate 102.

It should be noted that a size of the second airgaps 1620 formed using the present embodiments is defined by the thickness of the second dielectric liner 1220, a pitch between metal lines 110 and between metal lines 110 and metal line with top via 112, and a height of the metal lines 110. Thus, similar to the first airgaps 620, the size of the second airgaps 1620 can be adjusted or controlled according to design requirements.

Figure 17:
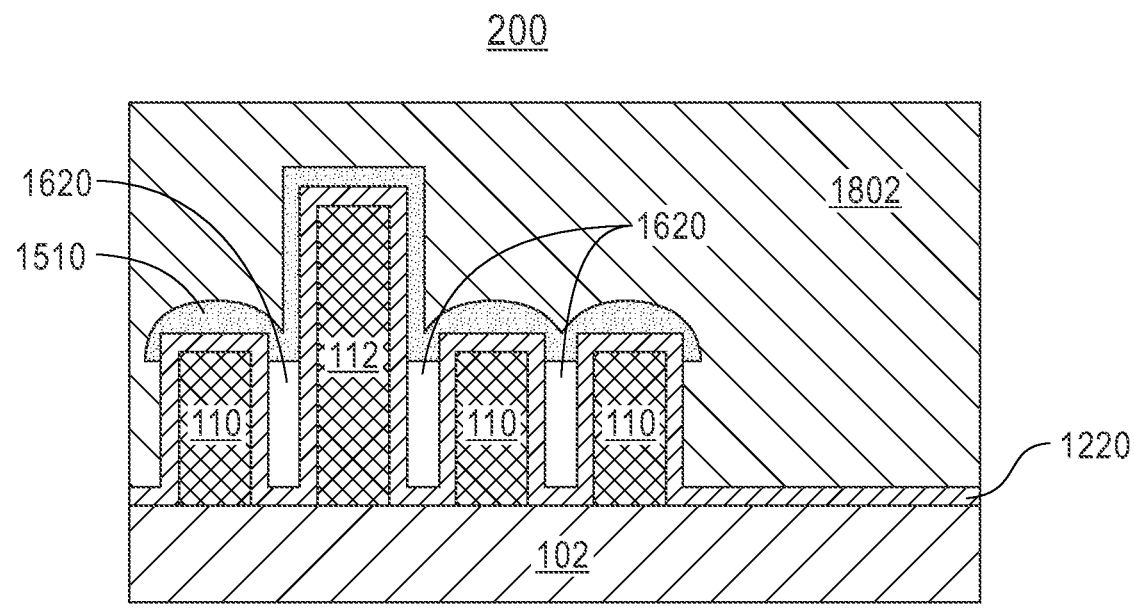
FIG. 17 is a cross-sectional view of the semiconductor structure after forming a second dielectric layer, according to another embodiment of the present disclosure.
Figure 18:
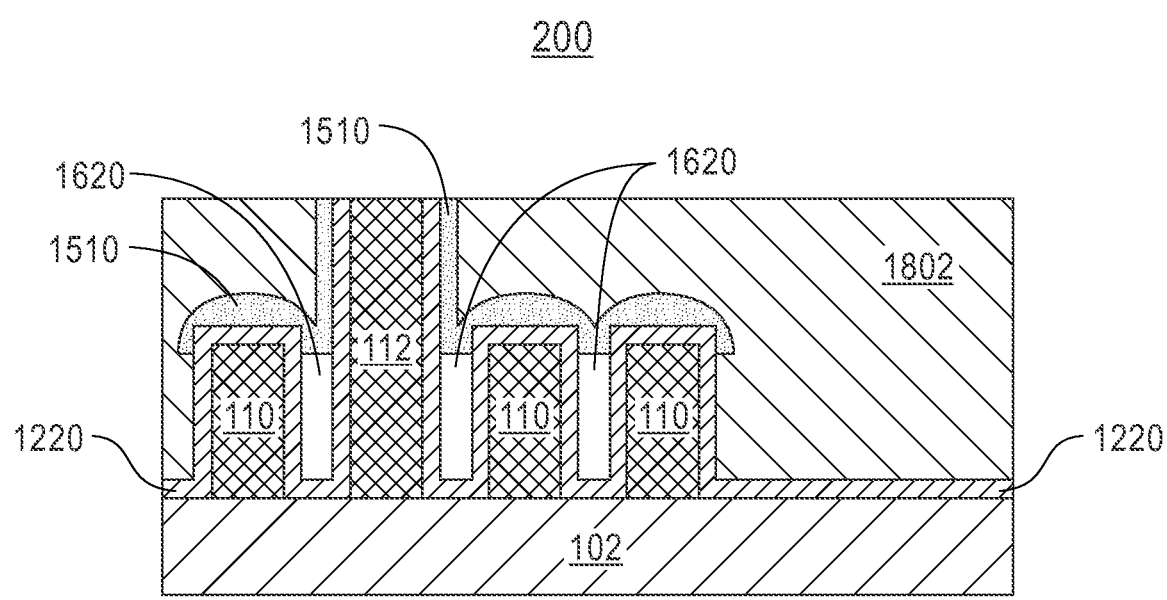
FIG. 18 is a cross-sectional view of the semiconductor structure after conducting a chemical mechanical polishing, according to another embodiment of the present disclosure.

Referring now to FIG. 17 and FIG. 18 simultaneously, cross-sectional views of the semiconductor structure 200 are shown after forming a second dielectric layer 1802 followed by a CMP process, according to an embodiment of the present disclosure.

The second dielectric layer 1802 is formed above the second dielectric cap 1510 and exposed lateral portions 1602 (FIG. 16) of the second dielectric liner 1220, as shown in FIG. 17. The second dielectric layer 1802 includes a low-k dielectric material. Exemplary low-k dielectric materials include, but are not limited to, silicon oxide, organosilicates, silsequioxanes, undoped silicate glass (USG), fluorosilicate glass (FSG), borophosphosilicate glass (BPSG), and hydrogenated carbon doped silicon oxide (SiCOH). The second dielectric layer 1802 may be formed by CVD, plasma enhanced chemical vapor deposition (PECVD) or spin coating. A thickness of the second dielectric layer 1802 can vary from approximately 100 nm to approximately 1,000 nm, although lesser and greater thicknesses can also be employed.

After deposition of the second dielectric layer 1802, a CMP process or etch back planerization process is generally conducted on the semiconductor structure 200. After this step, an uppermost surface of the metal line with top via 112 is exposed, as shown in FIG. 18.

Therefore, embodiments of the present disclosure provide BEOL interconnect structures with top via having airgaps of defined and consistent dimensions which can be maintained uniformly across die, field and wafer. In the proposed embodiments, airgap dimensions are defined by the ALD dielectric liner thickness, metal line pitch and metal line height. Thus, a size of the airgaps can be adjusted by tuning or modulating the thickness of the dielectric liner, metal line pitch and metal line height for satisfying design and/or performance requirements.

In an embodiment, a dielectric liner is first formed on top of metal lines with top via. The liner material can be high-k or moderate-k or low-k dielectric (e.g., HfOx, SiOx, SiN, SiC etc.) deposited using an ALD process. An organic planarizing material such as OPL is then used to coat the wafers. This acts as template material for air gap formation. The OPL is then etched back to expose the top of dielectric liner covered metal lines. A dielectric cap material is subsequently deposited on the exposed dielectric liner selective to the organic planarizing material. The cap material deposits preferentially on the dielectric liner and pinches off the space between two dielectric liner covered metal lines covering the organic material underneath. However, the cap material does not deposit on the organic material located in large open areas, keeping regions of the organic material exposed. A conventional $O_2$ ash can be used to remove all the organic material in the open area as well as from spaces between dielectric liner covered metal lines underneath the cap dielectric forming the airgaps.

In another embodiment, a thin ALD dielectric film is used to cap a top of the dielectric liner covered metal lines and then a lithography mask is used to expose open areas to punch the dielectric film exposing the organic material underneath.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Spatially relative terms, such as "inner," "outer," "beneath," "below," "lower," "above," "upper," "top," "bottom," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" may encompass both an orientation of above and below. The device may be otherwise oriented (rotated 90 degrees or at other orientations) and the spatially relative descriptors used herein interpreted accordingly.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
   a plurality of metal lines above a substrate;
   a dielectric liner above a top surface and opposite sidewalls of each of the plurality of metal lines and above a top surface of the substrate, portions of the dielectric liner located on the opposite sidewalls of each of the plurality of metal lines being separated by a space; and
   a dielectric cap above an uppermost surface of portions of the dielectric liner above each of the plurality of metal lines and above the space, the dielectric cap pinching-off the space between portions of the dielectric liner located on the opposite sidewalls of each of the plurality of metal lines for providing airgaps between the plurality of metal lines, wherein the dielectric liner directly contacts the airgaps along an entire length of a lower portion of a u-shaped valley between each of the plurality of metal lines.

2. The semiconductor structure of claim 1, wherein a size of the airgaps is determined by a thickness of the dielectric liner, a height of the plurality of metal lines and a pitch of the plurality of metal lines.

3. The semiconductor structure of claim 1, further comprising:
   a first dielectric layer above the dielectric cap.

4. The semiconductor structure of claim 1, wherein the substrate comprises a larger region extending horizontally from at least one metal line in the plurality of metal lines.

5. The semiconductor structure of claim 4, wherein the first dielectric layer covers the larger region extending horizontally from the at least one metal line.

6. The semiconductor structure of claim 1, wherein the dielectric liner comprises at least one of a high-k dielectric material and a moderate-k dielectric material.

7. The semiconductor structure of claim 3, wherein the first dielectric layer comprises a low-k dielectric material.

8. A method of forming a semiconductor structure comprising:
   forming a plurality of metal lines above a substrate;
   conformally depositing a dielectric liner above a top surface and opposite sidewalls of each of the plurality of metal lines and above a top surface of the substrate, portions of the dielectric liner located on the opposite sidewalls of each of the plurality of metal lines being separated by a first space;
   depositing a first masking layer above the dielectric liner;
   recessing the first masking layer to expose top portions of the dielectric liner, remaining portions of the first masking layer substantially filling the first space, wherein a second space remains above recessed portions of the first masking layer between exposed top portions of the dielectric liner;
   forming a dielectric cap above the exposed top portions of the dielectric liner and above the remaining portions of the first masking layer to pinch-off the second space; and
   removing the first masking layer to form airgaps between adjacent metal lines covered by the dielectric liner.

9. The method of claim 8, further comprising:
   conducting on the first masking layer a first interface modification process by surface functionalization with self-assembled monolayers (SAMs) for increasing hydrophobicity and preventing deposition of metal-oxides.

10. The method of claim 8, wherein the first masking layer comprises an organic planarizing material.

11. The method of claim 8, further comprising:
    forming a first dielectric layer above the dielectric cap; and
    conducting a chemical mechanical polishing on the first dielectric layer.

12. The method of claim 8, wherein the dielectric liner comprises at least one of a high-k dielectric material and a moderate-k dielectric material.

13. A method of forming a semiconductor structure comprising:
    forming a plurality of metal lines above a substrate;
    conformally depositing a dielectric liner above a top surface and opposite sidewalls of each of the plurality of metal lines and above a top surface of the substrate, portions of the dielectric liner located on the opposite sidewalls of each of the plurality of metal lines being separated by a first space;
    depositing a first masking layer above the dielectric liner;
    recessing the first masking layer to expose top portions of the dielectric liner, remaining portions of the first masking layer substantially filling the first space, wherein a second space remains above recessed portions of the first masking layer between exposed top portions of the dielectric liner;
    forming a dielectric cap within the second space, above the exposed top portions of the dielectric liner and above remaining portions of the first masking layer; and
    forming a second masking layer above the dielectric cap.

14. The method of claim 13, further comprising:
    forming a silicon-containing antireflective layer above the second masking layer; and
    forming a photoresist layer containing a pattern above the silicon-containing antireflective layer.

15. The method of claim 14, further comprising:
    transferring the pattern to the third masking layer; and
    removing the photoresist layer and the silicon-containing antireflective layer.

16. The method of claim 15, wherein transferring the pattern exposes a region of the first masking layer located above a portion of the dielectric liner covering a larger area of the substrate that extends horizontally from at least one metal line.

17. The method of claim 13, further comprising:
    removing the first masking layer and the second masking layer to form airgaps between adjacent metal lines covered by the dielectric liner.

18. The method of claim 13, wherein the first masking layer and the second masking layer comprise an organic planarizing material.

19. The method of claim 13, wherein forming the dielectric cap comprises a conformal deposition process.

20. The method of claim 13, further comprising:
   forming a first dielectric layer above the dielectric cap; and
   conducting a chemical mechanical polishing on the first dielectric layer.

* * * * *